(12) United States Patent
Pangrle et al.

(10) Patent No.: US 9,343,666 B2
(45) Date of Patent: *May 17, 2016

(54) DAMASCENE METAL-INSULATOR-METAL (MIM) DEVICE WITH IMPROVED SCALEABILITY

(75) Inventors: Suzette K. Pangrle, Cupertino, CA (US); Steven Avanzino, Cupertino, CA (US); Sameer Haddad, San Jose, CA (US); Michael Vanbuskirk, Saratoga, CA (US); Manuj Rathor, Milpitas, CA (US); James Xie, San Jose, CA (US); Kevin Song, Santa Clara, CA (US); Christie Marrian, San Jose, CA (US); Bryan Choo, Mountain View, CA (US); Fei Wang, San Jose, CA (US); Jeffery A. Shields, Sunnyvale, CA (US)

(73) Assignee: CYPRESS SEMICONDUCTOR CORPORATION, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/529,284

(22) Filed: Jun. 21, 2012

(65) Prior Publication Data
US 2012/0276706 A1    Nov. 1, 2012

Related U.S. Application Data

(62) Division of application No. 11/521,204, filed on Sep. 14, 2006, now Pat. No. 8,232,175.

(51) Int. Cl.
    *H01L 21/20* (2006.01)
    *H01L 45/00* (2006.01)
    *H01L 27/24* (2006.01)

(52) U.S. Cl.
    CPC ............ *H01L 45/04* (2013.01); *H01L 27/2436* (2013.01); *H01L 45/1233* (2013.01);

(Continued)

(58) Field of Classification Search
    CPC . H01L 45/04; H01L 27/2436; H01L 45/1233; H01L 45/146
    USPC ............ 438/396, 399, 100, 608; 257/532, 41, 257/E21.006, E21.008, E21.009, E21.52
    See application file for complete search history.

(56) References Cited

U.S. PATENT DOCUMENTS

3,833,434 A     9/1974  Kikuchi et al.
3,877,049 A  *  4/1975  Buckley ............................. 257/4

(Continued)

FOREIGN PATENT DOCUMENTS

EP          1484799 A2      8/2004

OTHER PUBLICATIONS

International Search Report for International Application No. PCT/US07/19710 dated Aug. 11, 2008; 3 pages.
USPTO Advisory Action for U.S. Appl. No. 11/521,204 dated Apr. 24, 2009; 3 pages.

(Continued)

*Primary Examiner* — Robert Huber

(57) ABSTRACT

A present method of fabricating a memory device includes the steps of providing a dielectric layer, providing an opening in the dielectric layer, providing a first conductive body in the opening, providing a switching body in the opening, the first conductive body and switching body filling the opening, and providing a second conductive body over the switching body. In an alternate embodiment, a second dielectric layer is provided over the first-mentioned dielectric layer, and the switching body is provided in an opening in the second dielectric layer.

14 Claims, 16 Drawing Sheets

(52) U.S. Cl.
CPC .......... *H01L45/146* (2013.01); *H01L 45/1633* (2013.01); *H01L 45/1675* (2013.01); *H01L 45/1683* (2013.01)

(56) References Cited

U.S. PATENT DOCUMENTS

| | | | |
|---|---|---|---|
| 5,621,247 A | 4/1997 | Hirao et al. | |
| 5,985,747 A | 11/1999 | Taguchi | |
| 6,335,241 B1 | 1/2002 | Hieda et al. | |
| 6,376,325 B1 | 4/2002 | Koo | |
| 6,921,912 B2* | 7/2005 | Campbell | 257/4 |
| 8,089,113 B2* | 1/2012 | Pangrle et al. | 257/310 |
| 2002/0127886 A1* | 9/2002 | Moore et al. | 438/800 |
| 2002/0160551 A1 | 10/2002 | Harshfield | |
| 2002/0190289 A1* | 12/2002 | Harshfield et al. | 257/295 |
| 2003/0027386 A1* | 2/2003 | Lee | 438/253 |
| 2005/0032307 A1 | 2/2005 | Karpov | |
| 2005/0141169 A1 | 6/2005 | Yamasaki | |
| 2006/0001049 A1 | 1/2006 | Forbes | |
| 2006/0250836 A1* | 11/2006 | Herner et al. | 365/148 |
| 2007/0012905 A1* | 1/2007 | Huang | 257/2 |
| 2007/0148814 A1* | 6/2007 | Pellizzer et al. | 438/102 |

OTHER PUBLICATIONS

USPTO Final Rejection for U.S. Appl. No. 11/521,204 dated Mar. 13, 2009; 11 pages.
USPTO Final Rejection for U.S. Appl. No. 11/521,204 dated Aug. 10, 2011; 25 pages.
USPTO Final Rejection for U.S. Appl. No. 11/521,204 dated Oct. 14, 2010; 18 pages.
USPTO Non-Final Rejection for U.S. Appl. No. 11/521,204 dated Jan. 30, 2012; 24 pages.
USPTO Non-Final Rejection for U.S. Appl. No. 11/521,204 dated Mar. 26, 2008; 17 pages.
USPTO Non-Final Rejection for U.S. Appl. No. 11/521,204 dated Mar. 30, 2011; 21 pages.
USPTO Non-Final Rejection for U.S. Appl. No. 11/521,204 dated May 6, 2010; 10 pages.
USPTO Non-Final Rejection for U.S. Appl. No. 11/521,204 dated Nov. 17, 2008; 8 pages.
USPTO Notice of Allowance for U.S. Appl. No. 11/521,204 dated Jun. 13, 2012; 8 pages.
Written Opinion of the International Searching Authority for International Application No. PCT/US07/19710 dated Aug. 11, 2008; 8 pages.

* cited by examiner

DAMASCENE METAL-INSULATOR-METAL (MIM) DEVICE WITH IMPROVED SCALEABILITY

CROSS-REFERENCES TO RELATED APPLICATIONS

This application is a Divisional Application of and claims priority to U.S. patent application Ser. No. 11/521,204, filed on Sep. 14, 2006, titled "DAMASCENE METAL-INSULATOR-METAL (MIM) DEVICE WITH IMPROVED SCALEABILITY," by Pangrle, et al, which is herein incorporated by reference.

BACKGROUND OF THE INVENTION

1. Technical Field

This invention relates generally to memory devices, and more particularly, to Metal-Insulator-Metal (MIM) devices and methods of fabrication thereof.

2. Background Art

FIGS. 1 and 2 illustrate a method of fabricating a Metal-Insulator-Metal (MIM) device using etching techniques. Initially, conductive layer 22 is provided on a substrate 20. Next, an insulating layer 24 is provided on the conductive layer 22. Then, another conductive layer 26 is provided on the insulating layer 24. It will be understood that the conductive layers 22, 26 and insulating layer 24 may be of a variety of materials. (It is further understood that the term "MIM" is used to describe such a device even though, for example, the top and/or bottom layers 22, 26 may be nonmetallic). Next, a photoresist layer 28 is provided over the conductive layer 26 and, using standard photolithographic techniques, the photoresist layer 28 is patterned as shown. Using the patterned photoresist layer 28 as a mask, the exposed material is etched away to remove portions of the conductive layer 22, insulating layer 24, and conductive layer 26, to form the remaining MIM stack 30 on the substrate 20. The photoresist 28 is then removed, resulting in the MIM device 30 including electrode 22A, switching layer 24A, and electrode 26A formed on the substrate 20.

It will be understood that the device stack must be properly formed to ensure proper operation of the device 30. For example, it is highly desirable that the etchant provide proper, even etching of the materials of the electrodes 22, 26 and insulating layer 24, meanwhile leaving the exposed material of the substrate 20 substantially intact (the "selectivity" of the etchant refers to the ability to properly remove selected material while leaving other material in contact therewith substantially intact). While the MIM device 30 of FIG. 2 is shown as ideally formed, it has occurred that, depending on the materials selected for the electrodes 22, 26 and insulating layer 24, and the etchant used, uneven etching of the materials of the layers 22, 24, 26 can take place, resulting in improper formation of the MIM stack 30 (for example one layer may etch more rapidly than the Other layers, resulting in a larger amount of that layer being etched away than the other layers (FIG. 3). In addition, undesirable gouging of the substrate 20 and layers 22, 24, 26 may take place. These phenomena cause degradation in performance in the resulting memory device.

In addition the above described approach has limited scaleability, resulting in less efficient manufacturing approaches.

Therefore, what is needed is an approach which avoids the above-cited problems, providing a properly and consistently formed MIM device with improved scaleability.

DISCLOSURE OF THE INVENTION

A present method of fabricating a memory device comprises providing a dielectric layer, providing an opening in the dielectric layer, providing a first conductive body in the opening, providing a switching body in the opening, the first conductive body and switching body filling the opening, and providing a second conductive body over the switching body.

The present invention is better understood upon consideration of the detailed description below, in conjunction with the accompanying drawings. As will become readily apparent to those skilled in the art from the following description, there is shown and described embodiments of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of illustrative embodiments when read in conjunction with the accompanying drawings, wherein:

BEST MODE(S) FOR CARRYING OUT THE INVENTION

Reference is now made in detail to specific embodiments of the present invention which illustrate the best mode presently contemplated by the inventors for practicing the invention.

Figure 1:
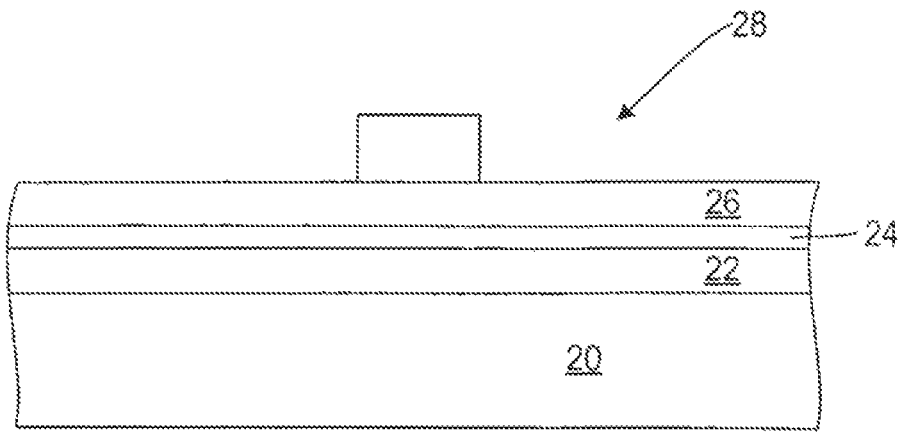
FIGS. 1-3 illustrate process steps in the formation of a MIM in accordance with a method of the prior art.
Figure 2:
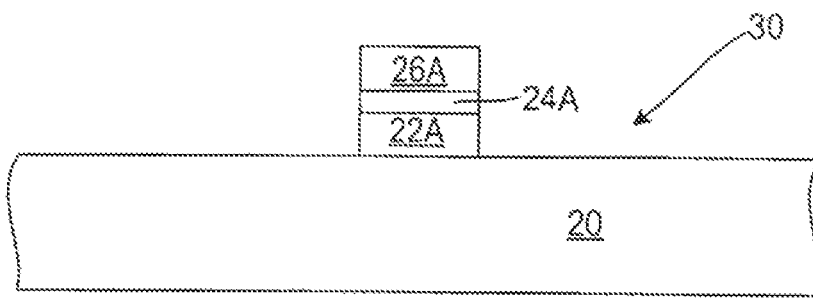
Figure 3:
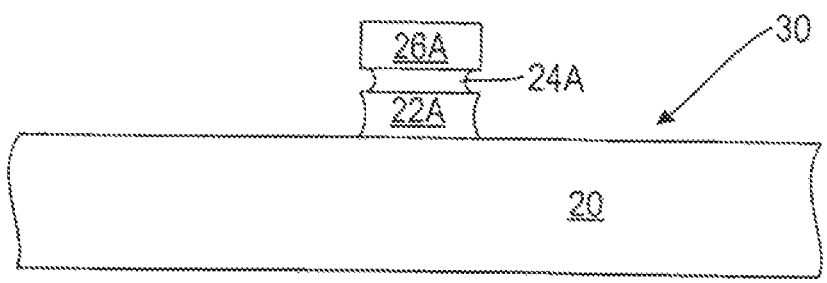
Figure 4:
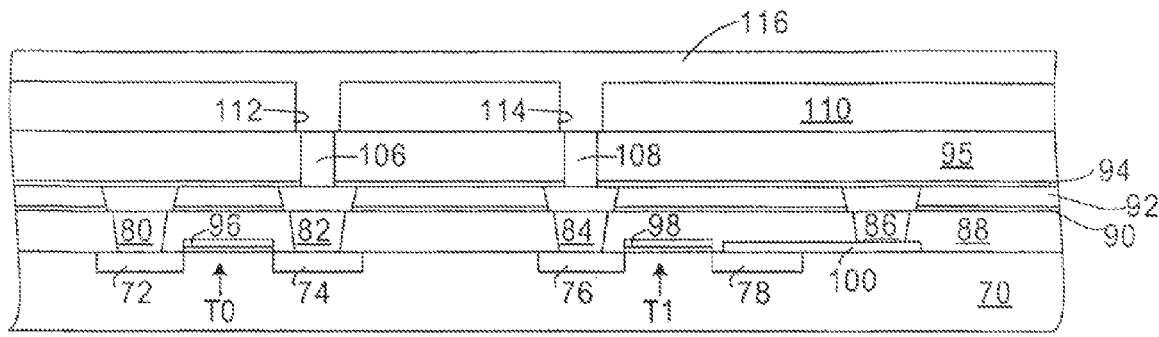
FIGS. 4-6 illustrate process steps in the formation of a first embodiment of MIM device in accordance with the present invention.

With reference to FIG. 4, the structure formed on a semiconductor wafer includes a p+ semiconductor substrate 70 having n+ regions 72, 74, 76, 78 formed therein. In contact with the respective n+ regions 72, 74, 76, 78 are conductive W plugs 80, 82, 84, 86 which extend through $SiO_2$ layer 88, SiN layer 90, and $SiO_2$ layer 92. Overlying the $SiO_2$ layer 92 and the tops of the W plugs 80, 82, 84, 86 is a SiN layer 94. The n+ regions 72, 74, along with gate and gate oxide 96, form transistor T0, and the n+ regions 76, 78, along with gate and gate oxide 98, form transistor T1. The plug 80 contacts the n+ source region 72 of the transistor T0, while the plug 82 contacts the n+ drain region 74 of the transistor T0. The plug 84 contacts the n+ drain region 76 of the transistor T1, while the plug 86, through W body 100 on the substrate 70, contacts the n+ source region 78 of the transistor T1. Conductive W plugs 106, 108 contact the respective plugs 82, 84 and extend through SiN layer 94 and an $SiO_2$ layer 95.

A nitride, for example SiN or SiON layer or ARC bilayer 110 is deposited over the resulting structure, to a thickness of for example 1000 angstroms. Using standard photolithographic techniques, openings 112, 114 are provided through the nitride layer 110 over the respective plugs 106, 108 so as to expose those plugs 106, 108. A conductive layer 116 is deposited on the resulting structure, on the nitride layer 110 and in the openings 112, 114 to contact the plugs 106, 108. The conductive layer 116 may for example be Ta, TaN, Ti, TiTiN, W, WN, Ni, Co, Al, Cu or any other suitable material. This deposition may be undertaken by for example PVD, ALD, CVD, PECVD or MOCVD.

Figure 5:
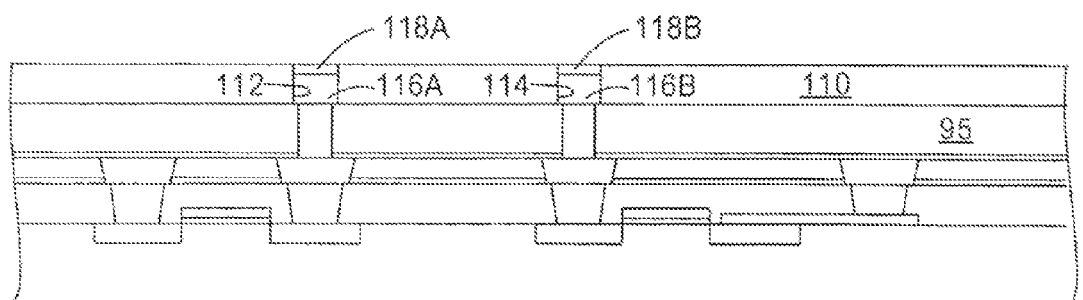

Referring to FIG. 5, a chemical-mechanical polishing step is undertaken, wherein portions of the layer 116 overlying the nitride layer 110, i.e., the overburden, are removed and the nitride 110 itself is exposed, and conductive bodies 116A, 116B are formed in the respective openings 112, 114, filling the respective openings 112, 114. Next, a thermal oxidation step is undertaken wherein the top portion of each conductive body is converted to its oxide, forming switching bodies 118A, 118B, so that the remaining conductive body 116A and switching body 118A on and in contact therewith fill the opening 112, and the remaining conductive body 116B and switching body 118B on and in contact therewith fill the opening 114. Other procedures such as ion implantation and plasma oxidation may be used to form the switching bodies.

Figure 6:
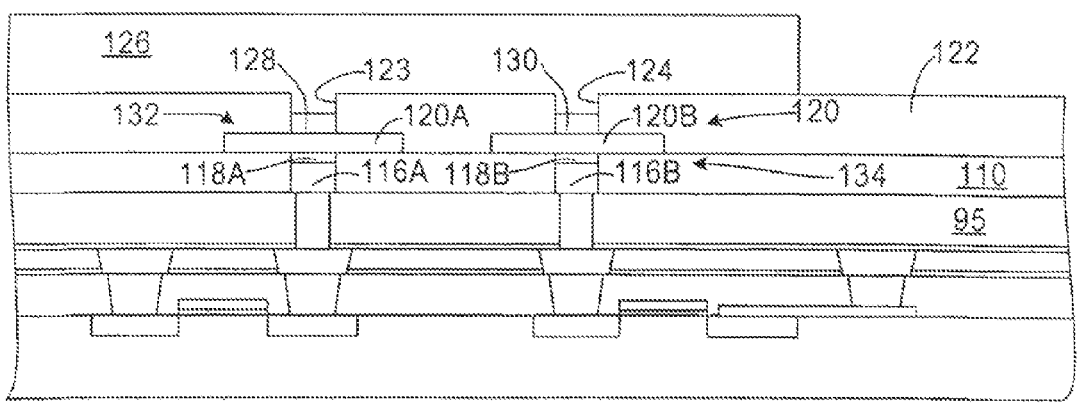

Referring to FIG. 6, a conductive layer 120 is deposited on the resulting structure. The conductive layer 120 may for example be Ta, TaN, Ti, TiTiN, W, WN, Ni, Co, Al, Cu or any other suitable material. Deposition may be undertaken by for example PVD, ALD, CVD, PECVD or MOCVD. Using standard photolithographic techniques, the conductive layer 120 is patterned to form conductive bodies 120A, 120B, conductive body 120A on and in contact with switching body 118A, and conductive body 120B on and in contact with switching body 118B.

An encapsulating dielectric layer 122, for example SiN, SiC, or a bilayer of SiN/SiON, SiC/SiN, or SiC/SiON, is deposited on the resulting structure. An oxidative pretreatment may be undertaken prior to this deposition to improve adhesion and form an insulating layer across the common surface. Using standard photolithographic techniques, openings 123, 124 are provided in the layer 122 to expose the conductive bodies 120A, 120B. A conductive metal layer 126 is deposited on the resulting structure, connected to the conductive bodies 120A, 120B by conductive Ti/TiN glue layers 128, 130. As an alternative in this and other embodiments showing and describing an encapsulating layer (layer 122 in this embodiment), this encapsulating layer can be eliminated and the metal layer subsequently provided (layer 126 in this embodiment) can be directly deposited.

The conductive body 116A (electrode), switching body 118A, and conductive body 120A (electrode) form a metal-insulator-metal (MIM) memory device 132. Likewise, the conductive body 116B (electrode), switching body 118B, and conductive body 120B (electrode) form a metal-insulator-metal (MIM) memory device 134. The present approach is a damascene process wherein elements are provided in trenches and chemical-mechanical planarization processes are undertaken thereon. As will be seen, using this approach, etching to form the MIM device is not used, avoiding the problems described above. Rather, a highly efficient and simple approach as presently described is used. Furthermore, this approach allows for improved scaleability in fabricating the structure.

Figure 7:
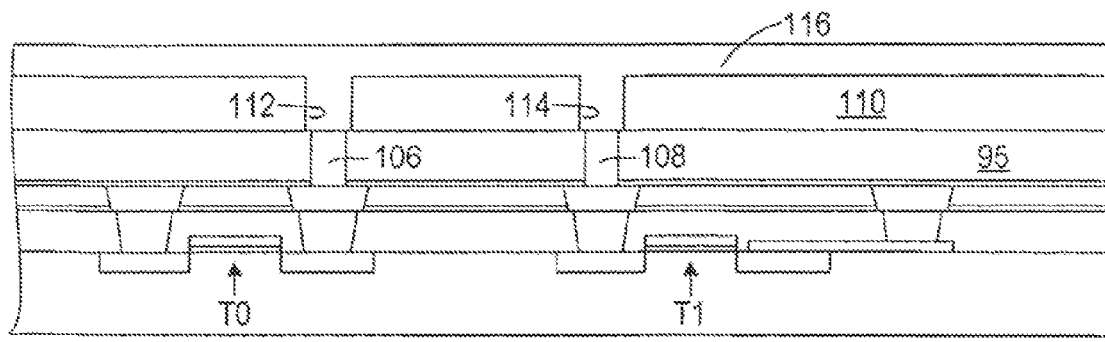
FIGS. 7-9 illustrate process steps in the formation of a second embodiment of MIM device in accordance with the present invention.
Figure 8:
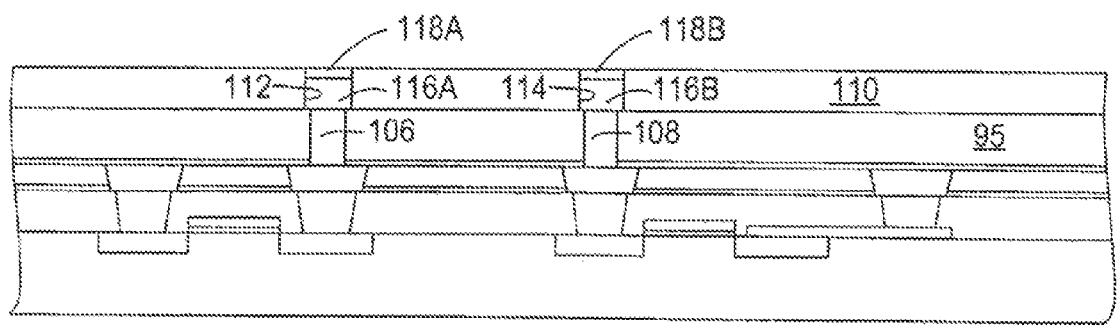
Figure 9:
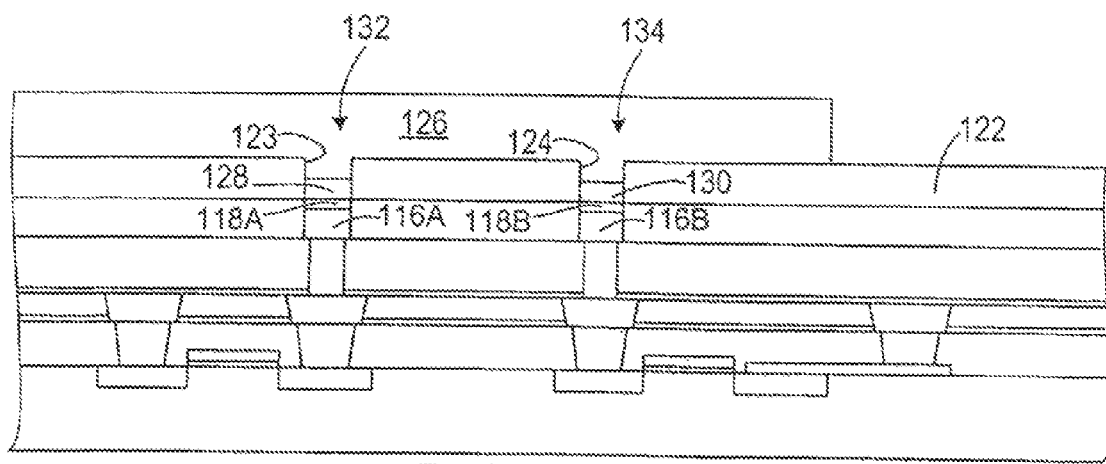

FIGS. 7-9 illustrate a second embodiment of the invention. In this embodiment, with reference to FIGS. 7 and 8, the nitride layer 110, openings 112, 114, conductive bodies 116A, 116B, and switching bodies 118A, 118B are formed as in FIGS. 4 and 5. As the next step, however, with reference to FIG. 9, an encapsulating dielectric layer 122 is deposited on the resulting structure. Using standard photolithographic techniques, openings 123, 124 are provided in the layer 122 to expose the switching bodies 118A, 118B. A conductive metal layer 126 is deposited on the resulting structure, connected to the switching bodies 118A, 118B by conductive Ti/TiN glue layers 128, 130.

The conductive body 116A (electrode), switching body 118A, and conductive body, i.e., glue layer 128 (electrode) form a metal-insulator-metal (MIM) memory device 132. Likewise, the conductive body 116B (electrode), switching body 118B, and conductive body, i.e., glue layer 130 (electrode) form a metal-insulator-metal (MIM) memory device 134. This approach provides advantages similar to those set forth above with regard to the embodiment of FIGS. 4-6, and does not require formation of conductive bodies 120A, 120B.

Figure 10:
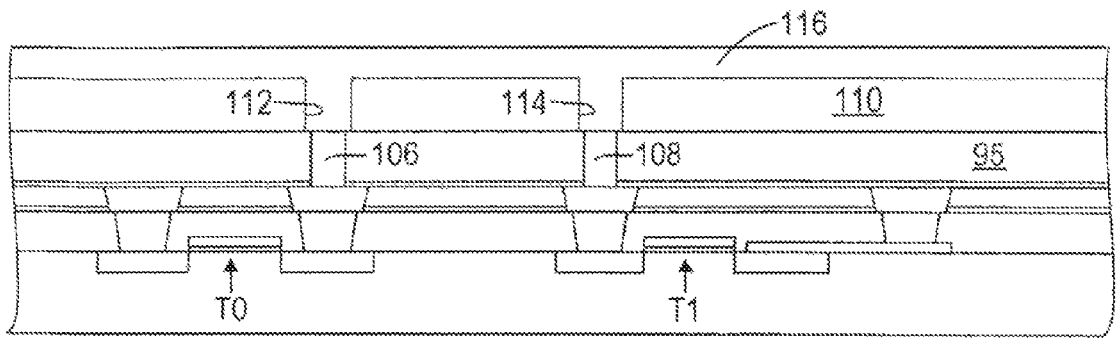
FIGS. 10-12 illustrate process steps in the formation of a third embodiment of MIM device in accordance with the present invention.
Figure 11:
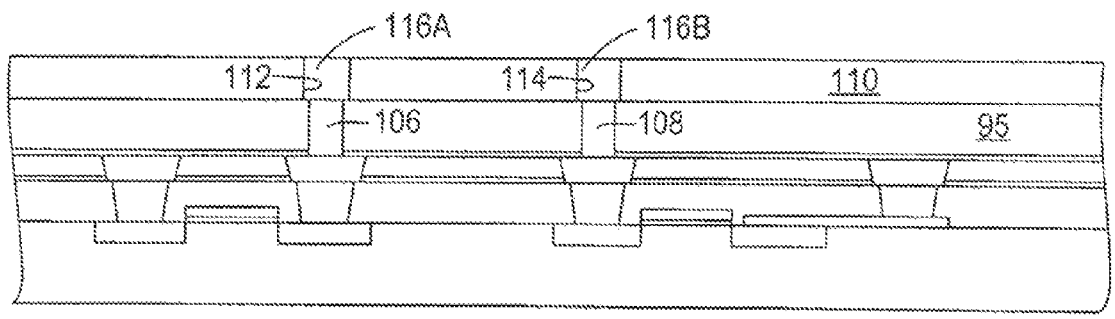
Figure 12:
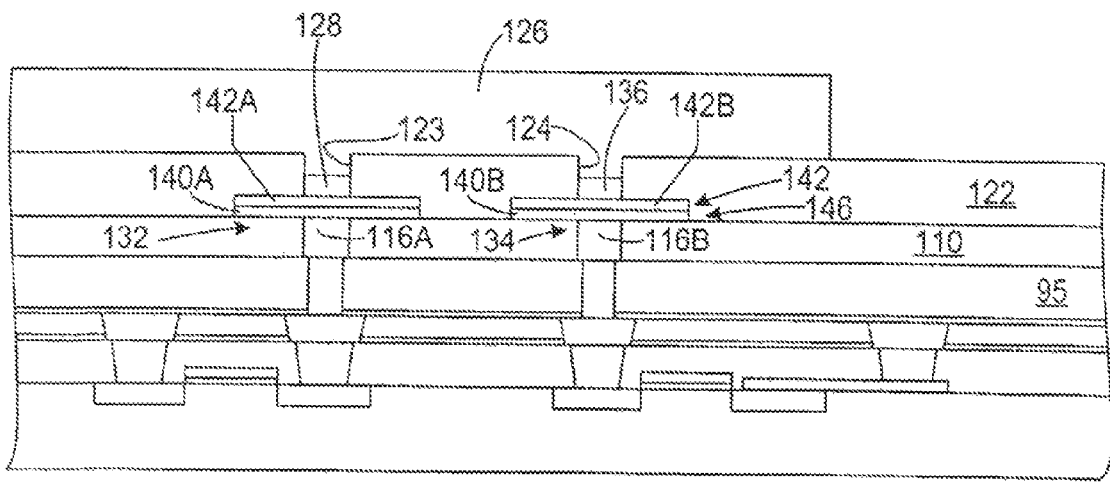

FIGS. 10-12 illustrate a third embodiment of the invention. In this embodiment, with reference to FIGS. 10 and 11, the nitride layer 110, openings 112, 114, and conductive bodies 116A, 116B are formed as in FIGS. 4 and 5. However, at this point, switching bodies are not formed as previously described. Rather, with reference to FIG. 12, a layer of switching material 140 is deposited on the resulting structure, in contact with the nitride layer 110 and the conductive bodies 116A, 116B. Next, a conductive layer 142 is deposited on the layer of switching material 140. Using standard photolithographic techniques, the conductive layer 142 and layer of switching material 140 are patterned as illustrated, so that conductive body 142A is on switching body 140A, and conductive body 142B is on the switching body 142B, furthermore with switching body 140A on the conductive body 116A and switching body 140B on the conductive body 116B.

An encapsulating dielectric layer 122 is deposited on the resulting structure. Using standard photolithographic techniques, openings 123, 124 are provided in the layer 122 to expose the conductive bodies 142A, 142B. A conductive metal layer 126 is deposited on the resulting structure, connected to the conductive bodies 142A, 142B by conductive Ti/TiN glue layers 128, 130.

The conductive body 116A (electrode), switching body 140A, and conductive body 142A (electrode) form a metal-insulator-metal (MIM) memory device 132. Likewise, the conductive body 116B (electrode), switching body 140B, and conductive body 142B (electrode) form a metal-insulator-metal (MIM) memory device 134.

Figure 13:
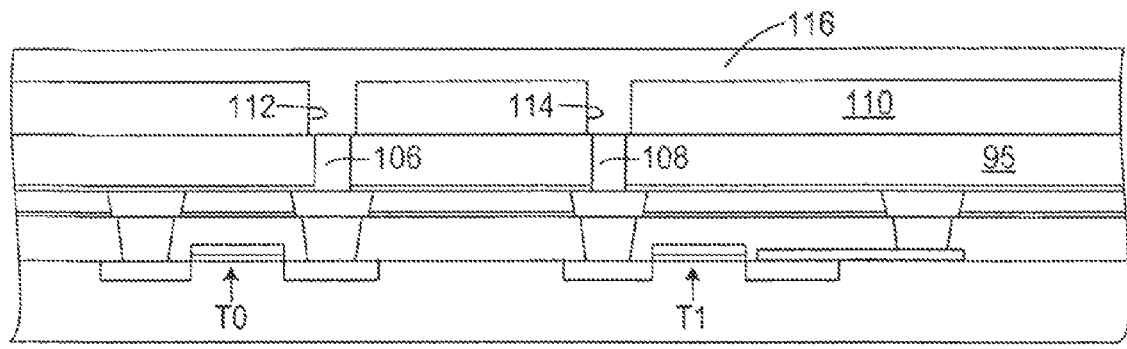
FIGS. 13-15 illustrate process steps in the formation of a fourth embodiment of MIM device in accordance with the present invention.
Figure 14:
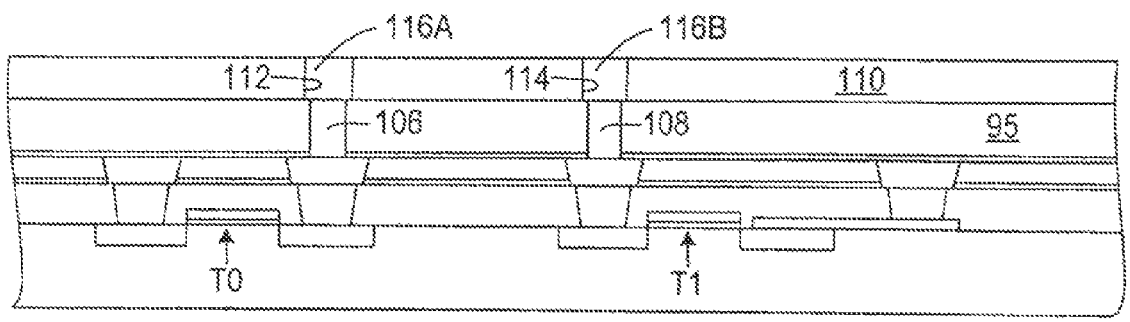
Figure 15:
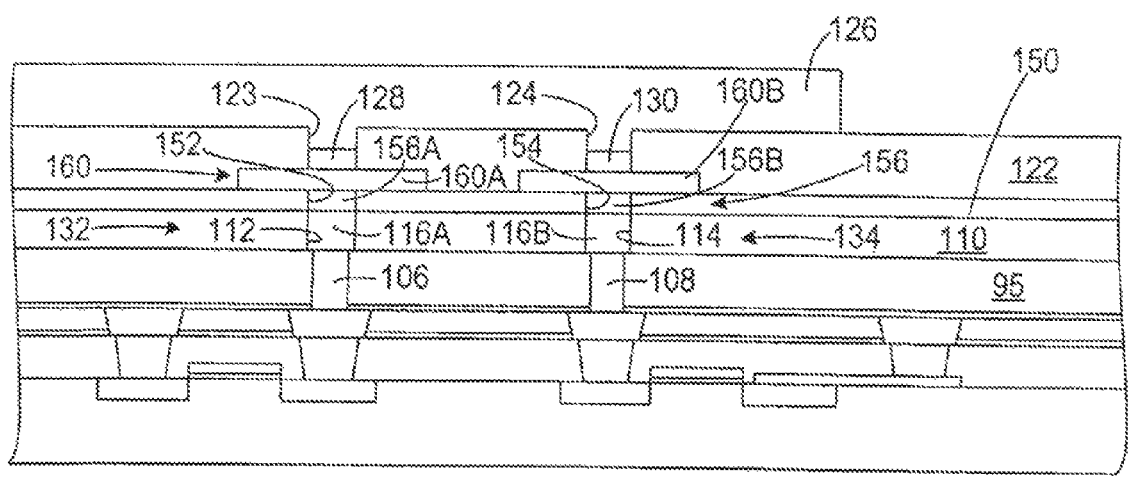

FIGS. 13-15 illustrate a fourth embodiment of the invention. In this embodiment, with reference to FIGS. 13 and 14, the nitride layer 95, openings 112, 114, and conductive bodies 116A, 116B are formed as in FIGS. 10 and 11. Next (FIG. 15), a dielectric, for example SiN layer 150 is deposited on the resulting structure, and, using standard photolithographic techniques, openings 152, 154 are provided therein. A layer of switching material 156 is deposited on the resulting structure, filling the openings 152, 154 in the dielectric layer 150 and contacting the conductive bodies 116A, 116B. A chemical-mechanical polishing step is undertaken to remove the portions of the layer of switching material 156 from over the dielectric layer 150, so that switching bodies 156A, 156B remain in the openings 152, 154 in the dielectric layer 150, filling the openings 152, 154 in the dielectric layer 150.

Next, a conductive layer 160 is deposited on the resulting structure. Using standard photolithographic techniques, the conductive layer 160 is patterned as illustrated, so that conductive body 160A is on the switching body 156A, and conductive body 160B is on the switching body 156B.

An encapsulating dielectric layer 122 is deposited on the resulting structure. Using standard photolithographic techniques, openings 123, 124 are provided in the layer 122 to expose the conductive bodies 160A, 160B. A conductive metal layer 126 is deposited on the resulting structure, connected to the conductive bodies 160A, 160B by conductive Ti/TiN glue layers 128, 130.

The conductive body 116A (electrode), switching body 156A, and conductive body 160A (electrode) form a metal-insulator-metal (MIM) memory device 132. Likewise, the conductive body 116B (electrode), switching body 156B, and conductive body 160B (electrode) form a metal-insulator-metal (MIM) memory device 134.

Figure 16:
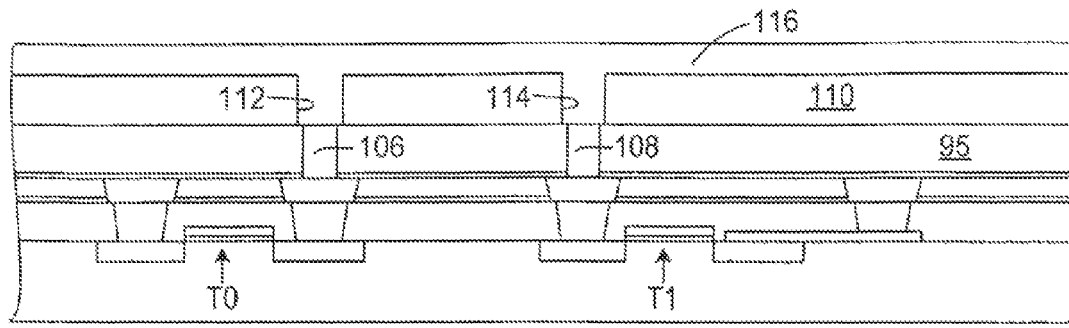
FIGS. 16-18 illustrate process steps in the formation of a fifth embodiment of MIM device in accordance with the present invention.
Figure 17:
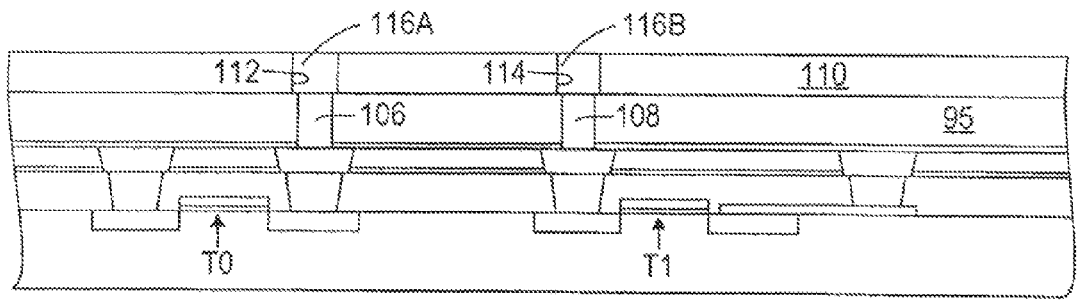
Figure 18:
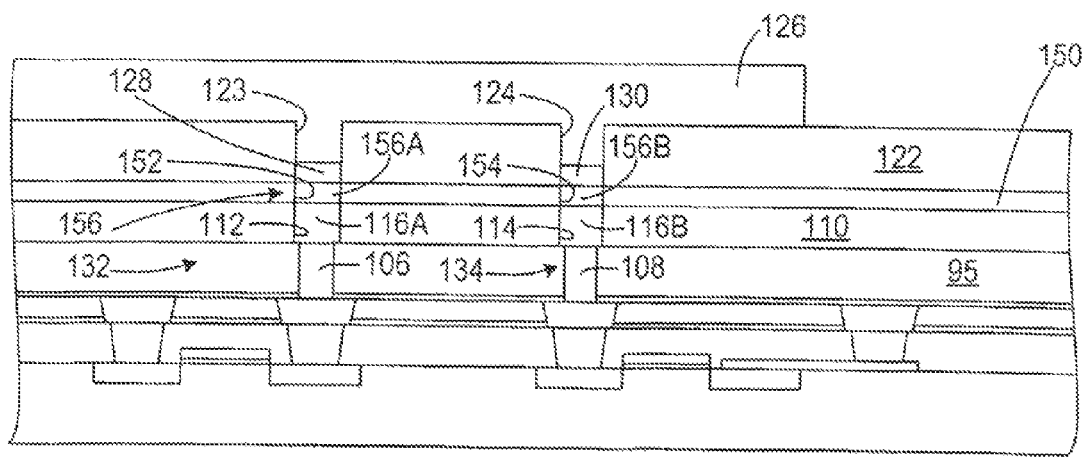

FIGS. 16-18 illustrate a fifth embodiment of the invention. In this embodiment, with reference to FIGS. 16 and 17, the nitride layer 110, openings 112, 114, and conductive bodies 116A, 116B are formed as FIGS. 10 and 11. Next (FIG. 18), a dielectric, for example SiN layer 150 is deposited on the resulting structure, and, using standard photolithographic techniques, openings 152, 154 are provided therein. A layer of switching material 156 is deposited on the resulting structure, filling the openings 152, 154 in the dielectric layer 150 and contacting the conductive bodies 116A, 116B. A chemical-mechanical polishing step is undertaken to remove the portions of the layer of switching material 156 from over the dielectric layer 150, so that switching bodies 156A, 156B remain in the openings 152, 154 in the dielectric layer 150, filling the openings 152, 154 in the dielectric layer 150.

An encapsulating dielectric layer 122 is deposited on the resulting structure. Using standard photolithographic techniques, openings 123, 124 are provided in the layer 122 to expose the conductive bodies 156A, 156B. A conductive metal layer 126 is deposited on the resulting structure, connected to the conductive bodies 156A, 156B by conductive Ti/TiN glue layers 128, 130.

The conductive body 116A (electrode), switching body 156A, and conductive body, i.e. glue layer 128, (electrode) form a metal-insulator-metal (MIM) memory device 132. Likewise, the conductive body 116B (electrode), switching body 156B, and conductive body, i.e. glue layer 130 (electrode) form a metal-insulator-metal (MIM) memory device 134.

Figure 19:
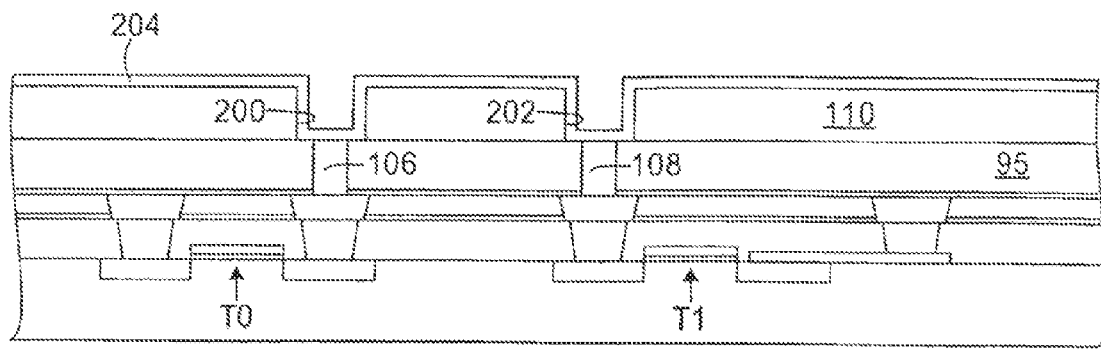
FIGS. 19-24 illustrate process steps in the formation of a sixth embodiment of MIM device in accordance with the present invention.
Figure 20:
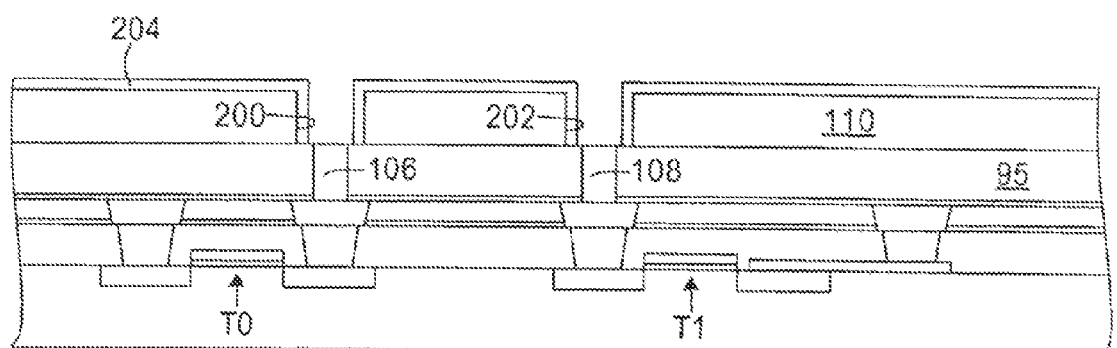

FIGS. 19-24 illustrate a sixth embodiment of the invention. In this embodiment, similar to the previous embodiments, openings 200, 202 are provided in the nitride layer 110. As the next step, an insulating layer 204, for example SiN, SiC or nonconductive metal oxide, is deposited over the resulting structure (FIG. 19). The portions of the insulating layer 204 in contact with the plugs 106, 108 are removed using standard photolithographic techniques, resulting in the structure of FIG. 20.

Figure 21:
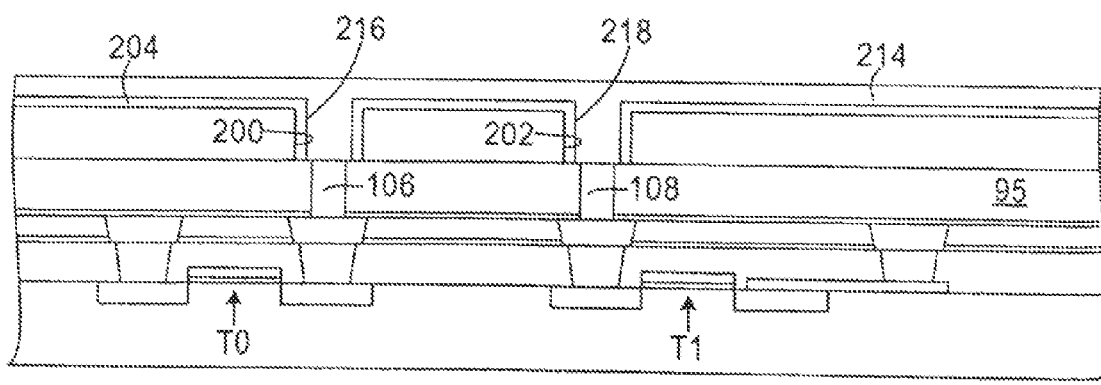
Figure 22:
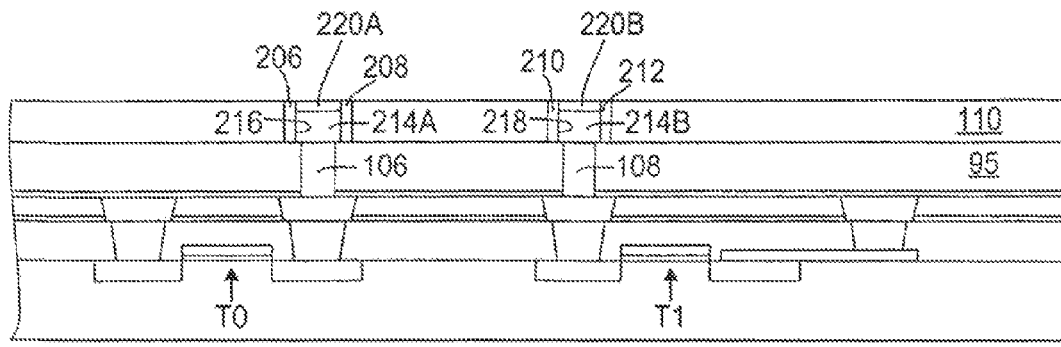

A conductive layer 214 is deposited on the resulting structure, on the nitride layer 110 and in the remaining openings 216, 218 to contact the plugs 106, 108 (FIG. 21). Referring to FIG. 22, a chemical-mechanical polishing step is undertaken, wherein portions of the layer 214 overlying the nitride layer 110 and portions of the insulating layer 204 overlying the nitride layer 110 are removed and the nitride 110 itself is exposed so that insulating walls 206, 208 are provided in the opening 200, and insulating walls 210, 212 are provided in the opening 202. Conductive bodies 214A, 214B are formed in the respective remaining openings 216, 218, filling the openings 216, 218. Next, switching bodies 220A, 220B are formed as previously described, so that the remaining conductive body 214A and switching body 220A on and in contact therewith fill the remaining opening 216, and the remaining conductive body 214B and switching body 220B on and in contact therewith fill the remaining opening 218. The conductive body 214A and switching body 220A are between the walls 206, 208, while the conductive body 214B and switching body 220B are between the walls 210, 212.

Next, a conductive layer 230 is deposited on the resulting structure. Using standard photolithographic techniques, the conductive layer 230 is patterned to form conductive bodies 230A, 230B, conductive body 230A on and in contact with switching body 220A, and conductive body 230B on and in contact with switching body 220B (FIG. 23).

Figure 23:
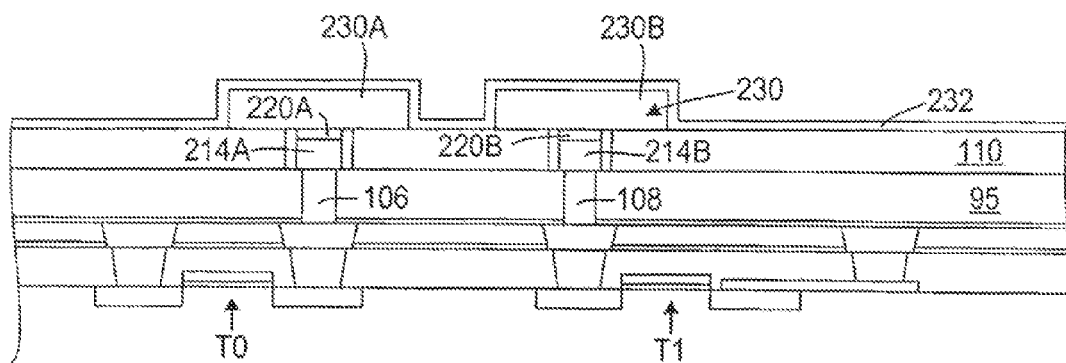
Figure 24:
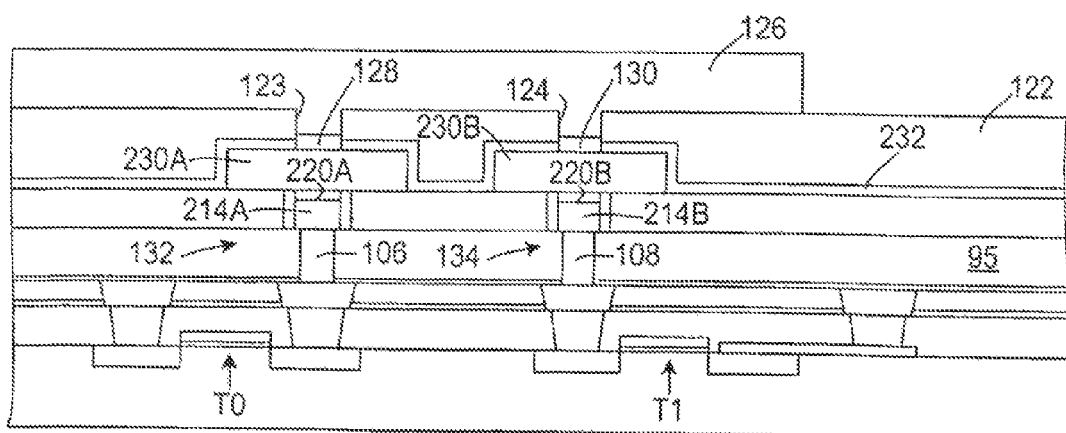

With reference to FIGS. 23 and 24, an insulating layer 232, for example SiN or SiC, is deposited on the resulting structure. An encapsulating dielectric layer 122 is deposited on the resulting structure. Using standard photolithographic techniques, openings 123, 124 are provided in the layer 122 and layer 232 to expose the conductive bodies 230A, 230B. A conductive metal layer 126 is deposited on the resulting structure, connected to the conductive bodies 230A, 230B by conductive Ti/TiN glue layers 128, 130.

The conductive body 214A (electrode), switching body 220A, and conductive body 230A (electrode) form a metal-insulator-metal (MIM) memory device 132. Likewise, the conductive body 214B (electrode), switching body 220B, and conductive body 230B (electrode) form a metal-insulator-metal (MIM) memory device 134.

Figure 25:
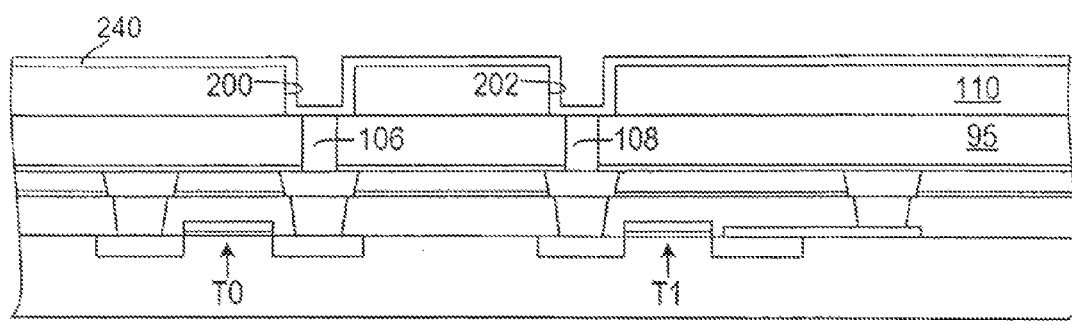
FIGS. 25-29 illustrate process steps in the formation of a seventh embodiment of MIM device in accordance with the present invention.

FIGS. 25-29 illustrate a seventh embodiment of the invention. In this embodiment, similar to the previous embodiments, openings 200, 202 are provided in the nitride layer 110. As the next step, a conductive layer 240, for example TiN, TaN, TiTiN, or WN, is deposited on the resulting structure (FIG. 25).

Figure 26:
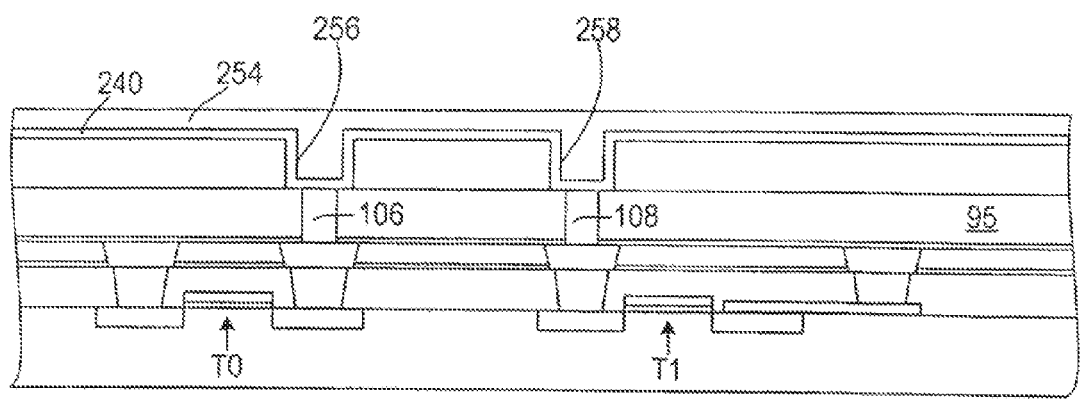
Figure 27:
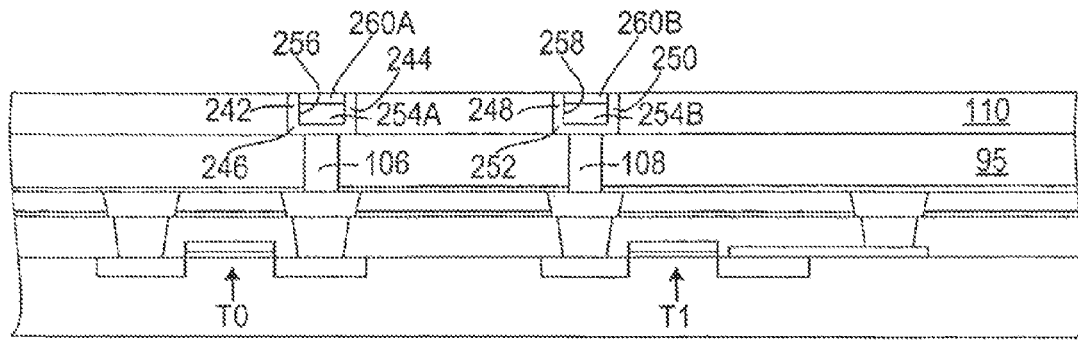

A conductive layer 254 is deposited on the resulting structure, and in the remaining openings 256, 258 (FIG. 26). Referring to FIG. 27, a chemical-mechanical polishing step is undertaken, wherein portions of the layer 254 overlying the nitride layer 110 and portions of the conductive layer 240 overlying the nitride layer 110 are removed, resulting in the structure of FIG. 27, with conductive walls 242, 244, and conductive connecting portion 246 connecting the walls 242, 244, all within the opening 200, and with conductive walls 248, 250, and conductive connecting portion 252 connecting the walls 248, 250, all within the opening 202. The nitride 110 itself is exposed, and conductive bodies 254A, 254B are formed in the respective remaining openings 256, 258, filling the respective openings 256, 258. Next, switching bodies 260A, 260B are formed as previously described, so that the remaining conductive body 254A and switching body 260A on and in contact therewith fill the remaining opening 256, and the remaining conductive body 254B and switching body 260B on and in contact therewith fill the remaining opening 258. The conductive body 254A and switching body 260A are between the walls 242, 244, with the conductive body 254A on the portion 246, while the conductive body 254B and switching body 260B are between the walls 248, 250, with the conductive body 254B on the portion 252.

Figure 28:
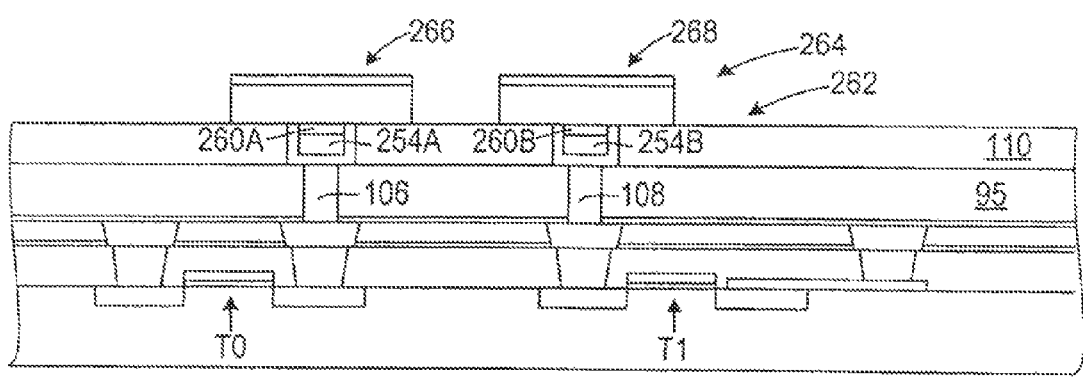

Next, a conductive layer 262 is deposited on the resulting structure. Then, a conductive layer 264, for example TiN, TaN, TiTiN, or WN, is deposited on the conductive layer 262. Using standard photolithographic techniques, the conductive layer 262 and conductive layer 264 are patterned to form conductive bodies 266, 268, conductive body 266 on and in contact with switching body 260A, and conductive body 268 on and in contact with switching body 260B (FIG. 28).

Figure 29:
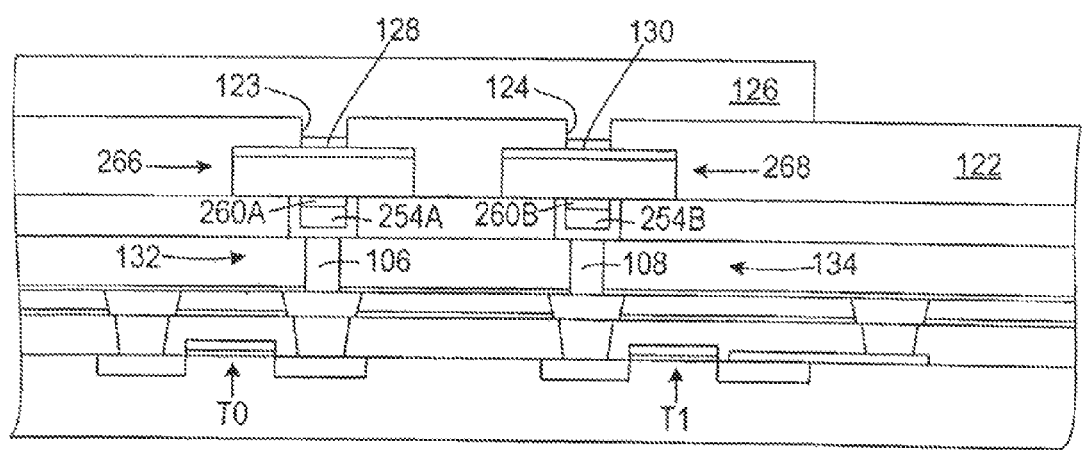

An encapsulating dielectric layer 122 is deposited on the resulting structure. Using standard photolithographic techniques, openings 123, 124 are provided in the layer 122 to expose the conductive bodies 266, 268. A conductive metal layer 126 is deposited on the resulting structure, connected to the conductive bodies 266, 268 by conductive Ti/TiN glue layers 128, 130 (FIG. 29).

The conductive body 254A (electrode), switching body 260A, and conductive body 266 (electrode) form a metal-insulator-metal (MIM) memory device 132. Likewise, the conductive body 254B (electrode), switching body 260B, and conductive body 268 (electrode) form a metal-insulator-metal (MIM) memory device 134.

Figure 30:
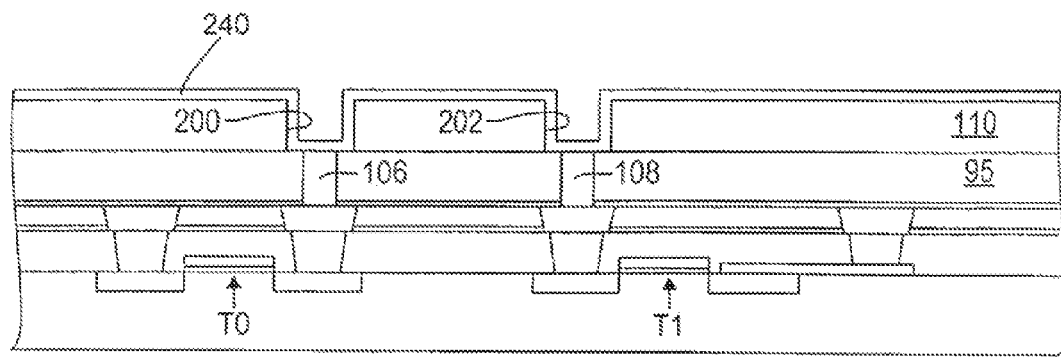
FIGS. 30-34 illustrate process steps in the formation of an eighth embodiment of MIM device in accordance with the present invention.
Figure 31:
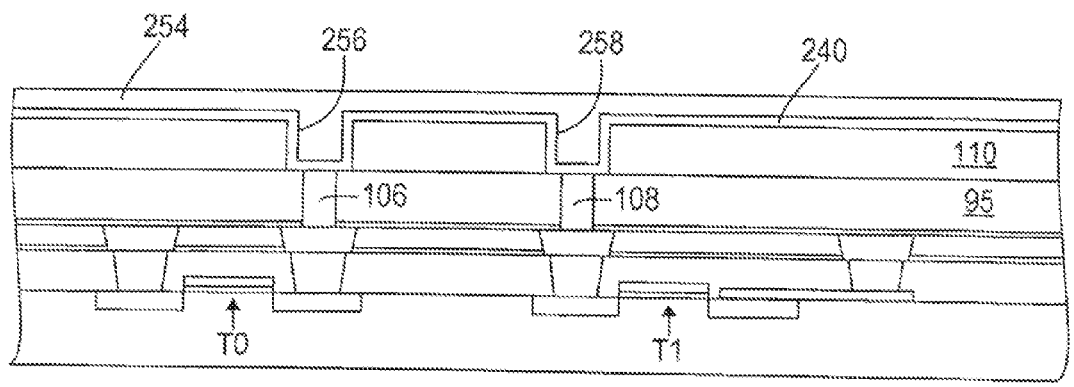
Figure 32:
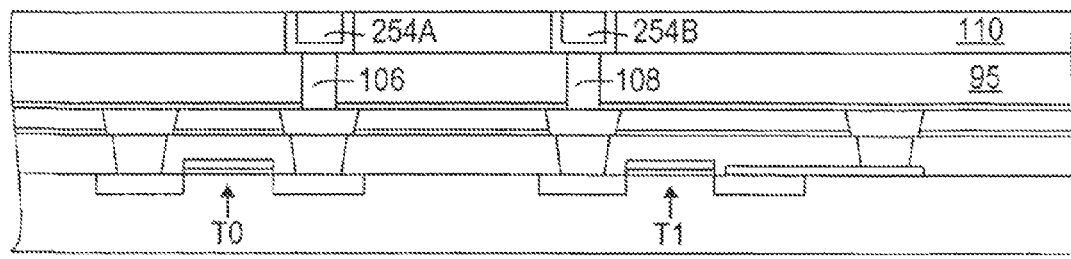
Figure 33:
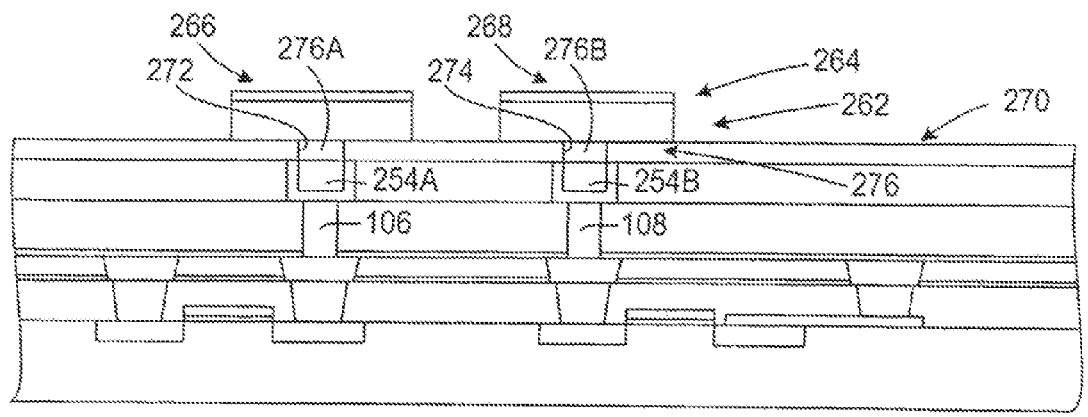

FIGS. 30-34 illustrate an eighth embodiment of the invention. The process steps of FIGS. 30-31 are similar to those of FIGS. 25-26. The structure of FIG. 31 is chemically-mechanically polished, resulting in the structure of FIG. 32. Next (FIG. 33), a dielectric layer 270, such as SiN, is deposited on the resulting structure, and openings 272, 274 are provided therein. A layer of switching material 276 is deposited on the resulting structure, filling the openings 272, 274 in the dielectric layer 270, and contacting the conductive bodies 254A, 254B. A chemical-mechanical polishing step is undertaken, wherein portions of the layer 276 overlying the dielectric layer 270 are removed and the dielectric layer 270 itself is exposed, and switching bodies 276A, 276B are formed in the respective openings 272, 274, filling the respective openings 272, 274. Then, a conductive layer 262 is deposited on the resulting structure, and a conductive layer 264 is deposited on the conductive layer 262. Using standard photolithographic techniques, the conductive layer 262 and conductive layer 264 are patterned to form conductive bodies 266, 268, conductive body 266 on and in contact with switching body 276A, and conductive body 268 on and in contact with switching body 276B.

Figure 34:
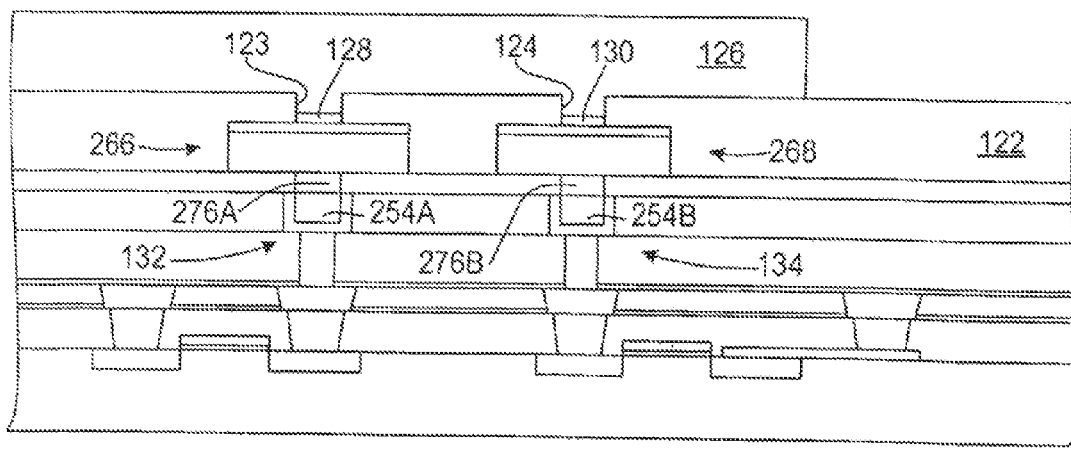

An encapsulating dielectric layer 122 is deposited on the resulting structure. Using standard photolithographic techniques, openings 123, 124 are provided in the layer 122 to expose the conductive bodies 266, 268. A conductive metal layer 126 is deposited on the resulting structure, connected to the conductive bodies 266, 268 by conductive Ti/TiN glue layers 128, 130 (FIG. 34).

The conductive body 254A (electrode), switching body 276A, and conductive body 266 (electrode) form a metal-insulator-metal (MIM) memory device 132. Likewise, the conductive body 254B (electrode), switching body 276B, and conductive body 268 (electrode) form a metal-insulator-metal (MIM) memory device 134.

Figure 35:
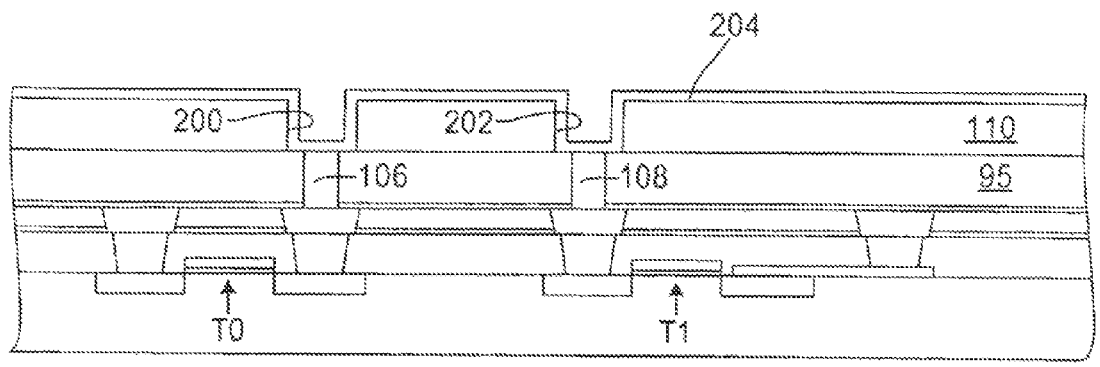
FIGS. 35-39 illustrate process steps in the formation of a ninth embodiment of MIM device in accordance with the present invention.
Figure 36:
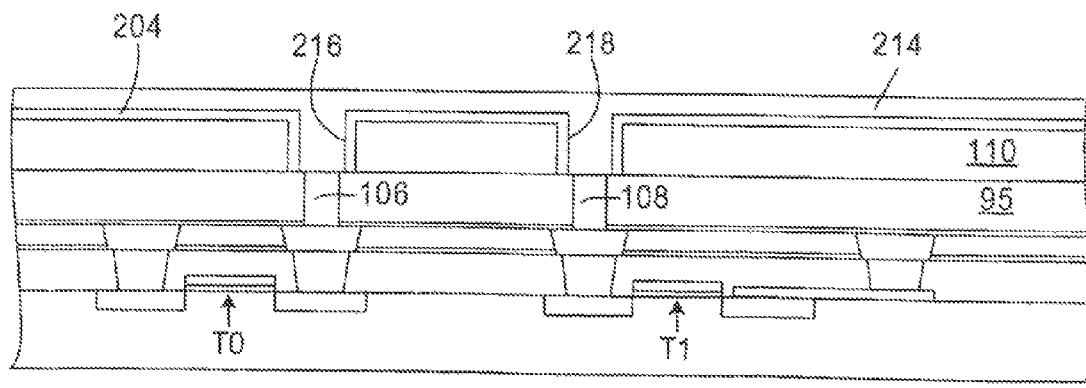
Figure 37:
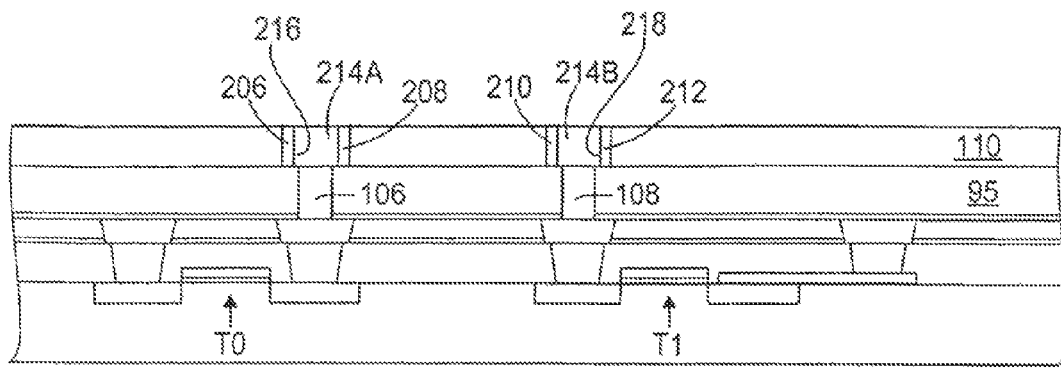
Figure 38:
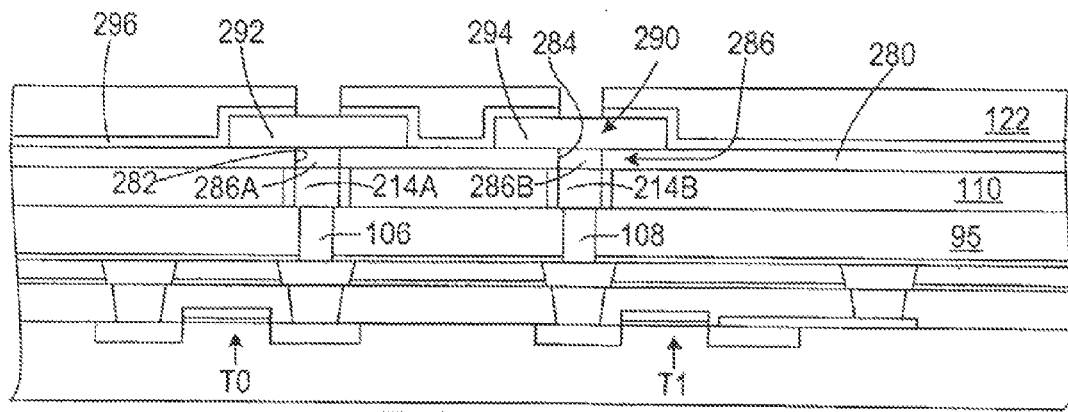

FIGS. 35-39 illustrate a ninth embodiment of the invention. The process steps of FIGS. 35-36 are similar to those of FIGS. 19-20. The structure of FIG. 36 is chemically-mechanically polished, resulting in the structure of FIG. 37. Next, with reference to FIG. 38, a dielectric, for example SiN layer 280 is deposited on the resulting structure, and openings 282, 284 are provided therein. A layer of switching material 286 is deposited on the resulting structure, filling the openings 282, 284 in the dielectric layer 280 and contacting the conductive bodies 214A, 214B. A chemical-mechanical polishing step is undertaken, wherein portions of the layer 286 overlying the layer 280, i.e., the overburden, are removed and the nitride 280 itself is exposed, and switching bodies 286A, 286B are formed in the respective openings 282, 284, filling the respective remaining openings 282, 284. Next, a conductive layer 290 is deposited on the resulting structure and is patterned as shown, forming conductive bodies 292, 294 in contact with the respective switching bodies 286A, 286B, and an insulating layer 296, for example SiN, is deposited on the resulting structure.

Figure 39:
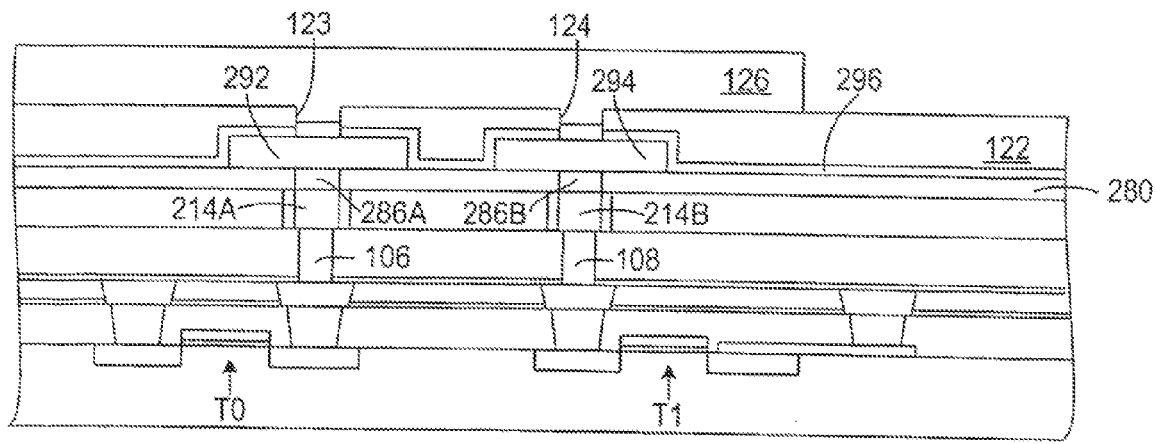

An encapsulating dielectric layer 122 is deposited on the resulting structure. Using standard photolithographic techniques, openings 123, 124 are provided in the layer 122 and layer 296 to expose the conductive bodies 292, 294. A conductive metal layer 126 is provided over the resulting structure, connected to the conductive bodies 292, 294 by conductive Ti/TiN glue layers 128, 130 (FIG. 39).

The conductive body 214A (electrode), switching body 286A, and conductive body 292 (electrode) form a metal-insulator-metal (MIM) memory device 132. Likewise, the conductive body 214B (electrode), switching body 286B, and conductive body 294 (electrode) form a metal-insulator-metal (MIM) memory device 132.

Figure 40:
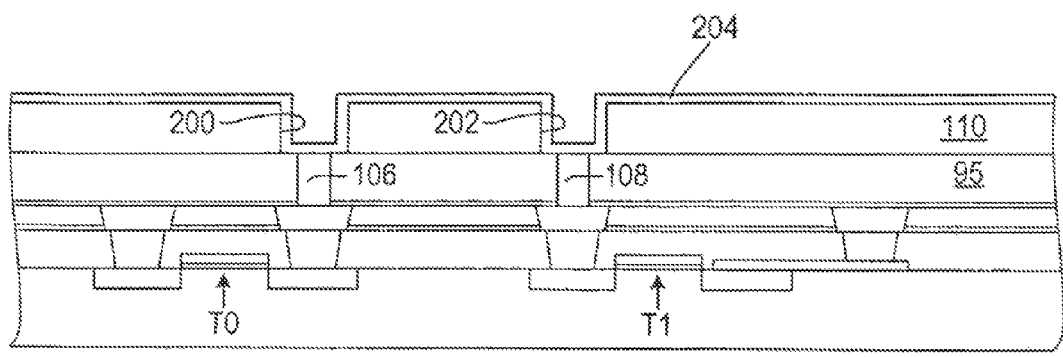
FIGS. 40-44 illustrate process steps in the formation of a tenth embodiment of MIM device in accordance with the present invention.
Figure 41:
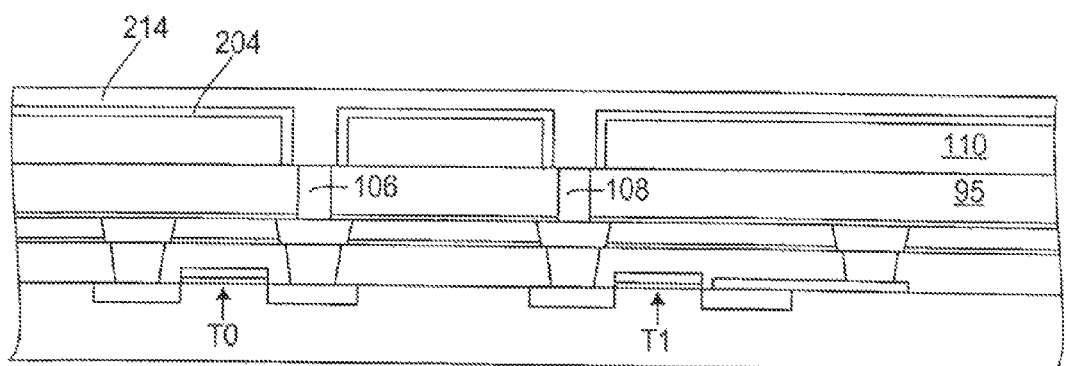
Figure 42:
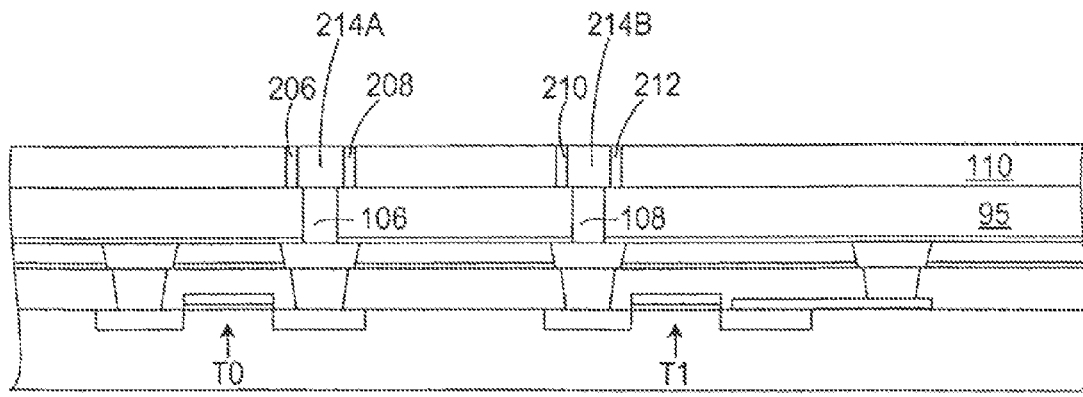
Figure 43:
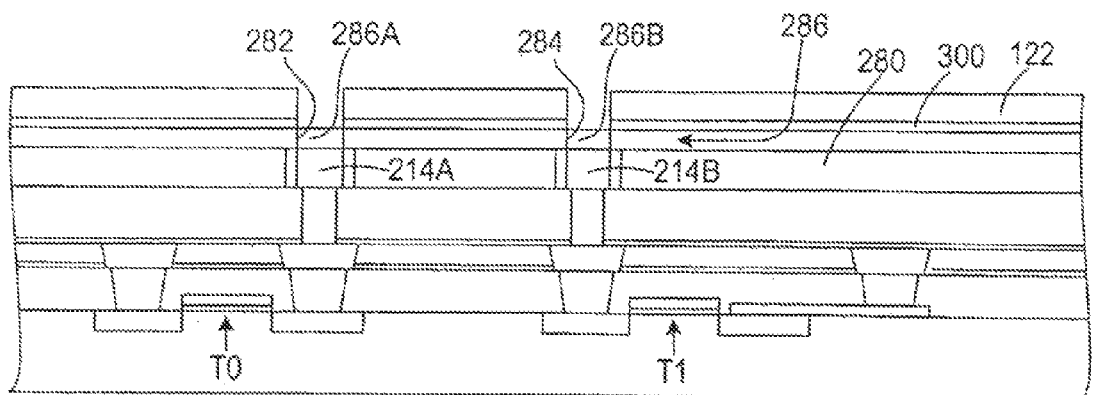
Figure 44:
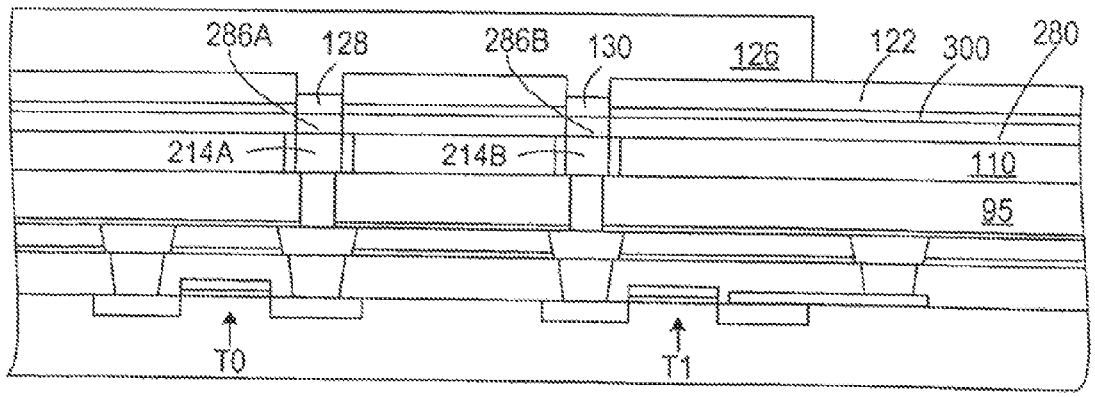

FIGS. 40-44 illustrate a tenth embodiment of the invention. The process steps of FIGS. 40-41 are similar to those of FIGS. 19-20. The structure of FIG. 41 is chemically-mechanically polished, resulting in the structure of FIG. 42. Next (FIGS. 43 and 44), a dielectric layer 280 is deposited on the resulting structure, and openings 282, 284 are provided therein. A layer of switching material 286 is deposited on the resulting structure, filling the openings 282, 284 in the dielectric layer 280 and contacting the conductive bodies 214A, 214B. A chemical-mechanical polishing step is undertaken, wherein portions of the layer 286 overlying the layer 280 are removed and the layer 280 itself is exposed, and switching bodies 286A, 286B are formed in the respective openings 282, 284, filling the respective openings 282, 284. An insulating layer 300, for example SiN, is deposited on the resulting structure, and an encapsulating dielectric layer 122 is deposited on the insulating layer 300. Using standard photolithographic techniques, openings 123, 124 are provided in the insulating layer 300 and dielectric layer 122, exposing the switching bodies 286A, 286B. A conductive metal layer 126 is provided over the resulting structure, connected to the switching bodies 286A, 286B by conductive Ti/TiN glue layers 128, 130.

The conductive body 214A (electrode), switching body 286A, and conductive body, i.e. glue layer 128 (electrode) form a metal-insulator-metal (MIM) memory device 132. Likewise, the conductive body 214B (electrode), switching body 286B, and conductive body, i.e., glue layer 130 (electrode) form a metal-insulator-metal (MIM) memory device 134.

The present approach provides various damascene processes for forming metal-insulator-medal memory devices. The various methods are straightforward and efficient in properly forming such devices. In particular, the problems set forth with regard to etching of materials to form devices is avoided. In addition, the present approaches provide for a high degree of scalability of devices.

The foregoing description of the embodiments of the invention has been presented for purposes of illustration and description. It is not intended to be exhaustive or to limit the invention to the precise form disclosed. Other modifications or variations are possible in light of the above teachings.

The embodiments were chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of fabricating a memory device, the method comprising:
   forming a first dielectric layer;
   forming an opening in the first dielectric layer;
   forming a first conductive body of a uniform material in the opening in the first dielectric layer to fill the opening in the first dielectric layer;
   forming a second dielectric layer over the first dielectric layer and the first conductive body;
   forming an opening in the second dielectric layer,
      wherein the opening in the second dielectric layer extends completely through the second dielectric layer and overlaps with the first conductive body;
   forming a switching body in the opening in the second dielectric layer to fill the opening in the second dielectric layer,
      wherein the switching body directly contacts the first conductive body and has sides that are coextensive with the sides the first conductive body;
   forming a third dielectric layer over the second dielectric layer and over the switching body;
   forming an opening in the third dielectric layer,
      wherein the opening in the third dielectric layer extends completely through the third dielectric layer and overlaps with the first conductive body; and
   forming a second conductive body in the opening in the third dielectric layer,
      wherein the second conductive body directly contacts the switching body layer and has sides that are coextensive with the sides the switching body,
   wherein the second conductive body directly contacts the switching body.

2. The method of claim 1 wherein the second conductive body is formed by forming a conductive layer over the second dielectric layer and switching body and patterning the conductive layer to form the second conductive body.

3. The method of claim 1, wherein a top surface of the switching body is coplanar with a top surface of the dielectric layer.

4. The method of claim 1, wherein the first conductive body is disposed over and is electrically coupled to one of a source region or a drain region of a transistor.

5. The method of claim 4, wherein the first conductive body is electrically coupled to the one of the source region or the drain region of the transistor using one or more tungsten plugs.

6. The method of claim 1, wherein the first dielectric layer comprises nitride.

7. The method of claim 1, wherein the first dielectric layer comprises silicon oxynitride.

8. The method of claim 1, wherein the first dielectric layer comprises an antireflective coating (ARC) bilayer.

9. The method of claim 1, wherein the second dielectric layer comprises silicon nitride.

10. The method of claim 1, wherein forming the switching body in the opening in the second dielectric layer comprises chemical-mechanical polishing to remove portions of the a switching material extending above the opening formed in the second dielectric layer.

11. The method of claim 1, wherein the third dielectric layer is an encapsulating dielectric layer.

12. The method of claim 1, further comprising forming an electrode over the second conductive body and electrically coupled to the second conductive body, wherein the electrode extends over the third dielectric layer.

13. The method of claim 12, wherein the second conductive body is operable as a glue layer between the electrode and the switching body.

14. The method of claim 13, wherein the second conductive body comprises Ti/TiN.

* * * * *